United States Patent [19]

Tada et al.

[11] Patent Number: 4,801,871
[45] Date of Patent: Jan. 31, 1989

[54] TESTING APPARATUS FOR SEMICONDUCTOR DEVICE

[75] Inventors: Tetsuo Tada; Hideshi Maeno, both of Itami, Japan

[73] Assignee: Mitsubishi Denki Kabushiki Kaisha, Tokyo, Japan

[21] Appl. No.: 909,303

[22] Filed: Sep. 19, 1986

[30] Foreign Application Priority Data

Sep. 20, 1985 [JP] Japan .................. 60-209418

[51] Int. Cl.⁴ .................. G01R 1/073; G01R 1/04
[52] U.S. Cl. .................. 324/73 R; 324/73 AT; 324/73 PC
[58] Field of Search .......... 324/73 R, 73 AT, 73 PC; 371/15, 16

[56] References Cited

U.S. PATENT DOCUMENTS

| | | | |
|---|---|---|---|
| 3,496,464 | 2/1970 | Janpersley | 324/73 R |
| 4,168,527 | 9/1979 | Winkler | 324/73 R |
| 4,180,203 | 12/1979 | Masters | 324/73 R |
| 4,275,464 | 6/1981 | Schmidt | 371/15 |
| 4,342,958 | 8/1982 | Russell | 324/73 R |
| 4,635,259 | 1/1987 | Shivabeck et al. | 324/73 R |
| 4,637,020 | 1/1987 | Shivabeck | 324/73 R |

FOREIGN PATENT DOCUMENTS 2100448 12/1982 United Kingdom .......... 324/73 PC

OTHER PUBLICATIONS

GR18 Complex VLSI Test System, by GenRad Semiconductor Test Inc., Sep. 1983.
International Test Conference 1987 Proceedings, Sep. 1987.
Mega One VLSI Test System Product Description, by Megatest Corp., 2/20/84, 3 pages.
"Multiple Matrix Switch: A High-Performance Universal Switching System", by Hovacs, 11/30/78, Internat. Auto. Test. Confer., pp. 112–118.

Primary Examiner—Reinhard J. Eisenzopf
Assistant Examiner—W. Burns
Attorney, Agent, or Firm—Lowe, Price, LeBlanc, Becker & Shur

[57] ABSTRACT

A connection of each of the terminals of a semiconductor device under test (DUT) with a test signal provided from a tester and a connection of each of the above stated terminals with a power supply system in the tester are selected in an arbitrary manner based on the serial data for designating connections provided from the tester.

10 Claims, 6 Drawing Sheets

FIG. 2

| DUT TERMINALS | OBJECT TO BE CONNECTED | LOGICAL OUTPUT VALUE OF MEMORY DEVICE CIRCUIT | ON OR OFF STATE OF RELAYS |
|---|---|---|---|
| 1f | POWER SOURCE | OUTPUT Q OF FV6 IS 0 AND OUTPUT Q OF FG6 IS 1 | RV6 IS ON, RG6 IS OFF, R1 IS OFF |
| 1e | GROUND | OUTPUT Q OF FV5 IS 1 AND OUTPUT Q OF FV5 IS 0 | RV5 IS OFF, RG5 IS ON, R1 IS OFF |
| 1d | PIN 3d (SIGNAL) | OUTPUT Q OF FV4 IS 1 AND OUTPUT Q OF FG4 IS 1 | RV4 IS OFF, RG4 IS OFF, R1 IS ON |

TESTING APPARATUS FOR SEMICONDUCTOR DEVICE

BACKGROUND OF THE INVENTION

1. Field of the Invention

This invention relates to a testing apparatus for testing a semiconductor device and particularly to a testing apparatus for testing a semiconductor device according to a test program by supplying a test signal to the semiconductor device under test having a plurality of terminals with a power supply system being connected thereto.

2. Description of the Prior Art

FIG. 5 is 1 view showing an example of a conventional testing apparatus for semiconductor device. This testing apparatus comprises a socket 2, a tester 3 and a load board 4. A semiconductor device under test (hereinafter referred to as DUT) is tested by this testing apparatus according to a predetermined test program. The DUT 1 is provided with terminals 1a to 1j, to which an external apparatus is connected. The socket 2 is formed so that the DUT 1 can be removably attached to the socket 2. Terminals 2a to 2j the number of which is equal to the number of the terminals 1a to 1j of the DUT 1 are provided in the socket 2. The terminals 1a to 1j of the DUT 1 put in the socket 2 and the terminals 2a to 2j of the socket 2 have one-to-one relations respectively. The tester 3 forming a main body of the testing apparatus transmits and receives a test signal to and from the DUT 1 and also applies and receives electric power to and from the DUT 1. Pins 3a to 3j for inputting and outputting the test signal and the electric power are provided in the tester 3. For these pins 3a to 3j, so-called "pogo pins" are usually used for the purpose of obtaining good electrical contact. The pogo pins are pins containing a spring, which are retracted when pressed and are returned to their initial state when released. The load board 4 serves to connect the socket 2 and the tester 3. The wiring board 4 is structured so that the test signal and the electric power from the tester 3 may be accurately transmitted to the terminals 2a to 2j of the socket 2.

In the above described testing apparatus, the signal from the tester 3 is applied to the DUT 1 through a path connecting for example a pin 3j, a wire on the wiring board 4, a terminal 2j and a terminal 1j, while the output from the DUT 1 is transmitted to the tester 3 through a path opposite to the above stated path.

FIG. 6 is a connection diagram of the testing apparatus shown in FIG. 5. Referring to FIG. 6, the tester 3 contains a plurality of pin electronics cards as shown by the dotted lines. Each pin electronics card comprises a circuit including various components on a substrate in the form of a card, to which a pin is attached. For example, a driver D, a comparator C and relays R1 and R2 are provided on a substrate. The driver D is interposed in a signal output path and the comparator C is interposed in a signal input path. The relays R1 and R2 serve to connect the driver D and the comparator C with the associated pin respectively. The relays R1 and R2 are turned on and off by control based on the test program. The tester 3 further contains a power source PS and a ground GND. In this example, the power source is connected to the pin 3f and the ground GND is connected to the pin 3e. The ground GND is a power source for applying a ground potential and the power source PS is a power source for applying a potential different from the ground potential. Therefore, the power source PS and the ground GND will be indicated in this specification as a power supply system which includes both the power source PS and the ground GND. The tester 3 further comprises, in addition to the above described components, a storage device for storing the above stated test program, a test signal generator and other components. However, illustration and description of such components will be omitted since they do not have direct relation with this invention.

The wiring board 4 is provided with wires 4a to 4j for electrically connecting the pins 3a to 3j with the terminals 2a to 2j of the socket 2.

Electric power from the power supply system is supplied to the DUT 1 through a path connecting the power source PS, the pin 3f, the wire 4f, the terminal 2f and the terminal 1f, or through a path connecting the ground GND, the pin 3e, the wire 4e, the terminal 2e and the terminal 1e. Generally, those power supply paths are fixedly connected by wires on the wiring board 4.

As described above, the power supply paths are fixed in the conventional testing apparatus. However, the terminals 1e and 1f of the DUT 1 are not always used as power supply terminals and other terminals are sometimes used as power supply terminals. Consequently, since there are various kinds of DUTs 1, it is necessary to change the connection for the power supply path each time a different kind of DUT 1 is used. Thus, such a conventional testing apparatus can not be used widely. In order to solve this problem, it may be considered to use a method in which a plurality of wiring boards 4 having different connections are prepared in advance and a suitable wiring board 4 is selected for testing according to the kind of the DUT 1 concerned. However, such a method is troublesome since it is necessary to change a wiring board each time a different kind of DUT 1 is used. In addition, the testing cost becomes high since a plurality of wiring boards need to be prepared.

SUMMARY OF THE INVENTION

An object of this invention is to provide a testing apparatus for semiconductor device having a wide range of applications, in which the testing cost can be reduced because a path for connecting a power supply system can be selected arbitrarily without changing load boards at least for DUTs having the same package form.

Briefly stated, this invention is adapted to change a connection for communication of a test signal with the terminals of a semiconductor device under test in an arbitrary manner according to a connection designating program contained in a test program and is also adapted to change a connection between the power supply system and the terminals of the semiconductor device under test in an arbitrary manner according to the connection designating program.

According to this invention, semiconductor devices having the same package form can be tested without changing wiring boards since the connection between the terminals of each semiconductor device and the power supply system can be changed in an arbitrary manner based on the connection designating program contained in the test program. Thus, this invention makes it possible to obtain a testing apparatus for semiconductor device which can be applied widely and by which the testing cost can be reduced.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a table for explaining an example of operation in the embodiment in FIG. 1.

DESCRIPTION OF THE PREFERRED EMBODIMENTS

Figure 1:
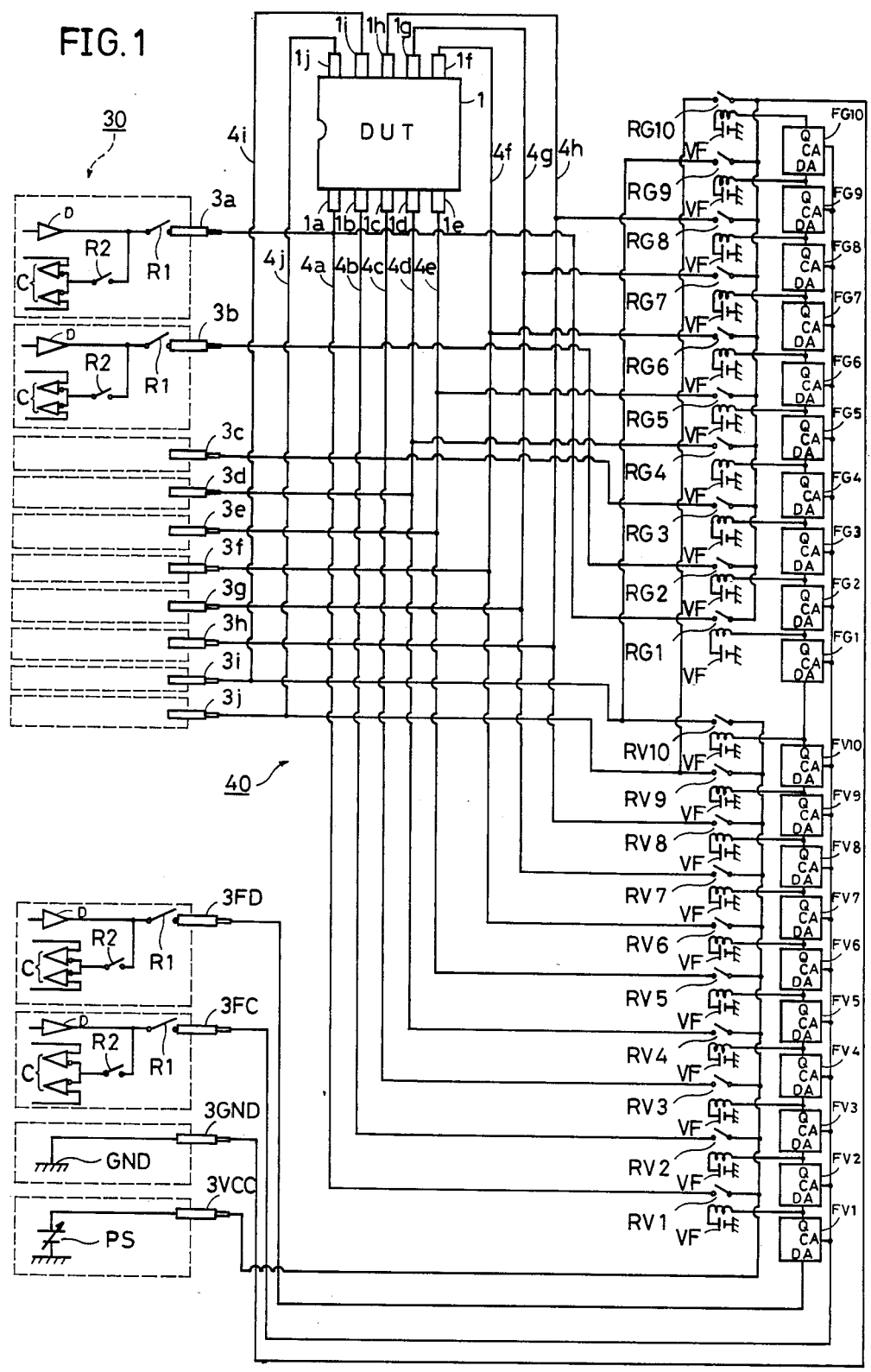
FIG. 1 is a block diagram showing an embodiment of this invention.

FIG. 1 is a block diagram showing an example of the present invention. Referring to FIG. 1, a tester 30 comprises pins 3FD, 3FC, 3GND and 3VCC in addition to the pins 3a to 3j. The pins 3a to 3j serve to input and output a test signal. The pins 3FD and 3FC serve to output serial data for setting memory devices to be described afterwards and shift clocks based on a connection designating program included in a test program. The pins 3GND and 3VCC serve to connect the power supply system in the tester 30 to an external apparatus. The tester 30 contains therein pin electronics cards of the same structure corresponding to the pins 3a to 3j, 3FD and 3FC. In each of those pin electronics cards, there are provided a driver D, a comparator C, relays R1 and R2 and the like in the same manner as described above with reference to FIG. 6. The tester 30 further contains a pin electronics card for connecting the pin 3GND with the ground GND and a pin electronics card for connecting the pin 3VCC with the power source PS.

Figure 5:
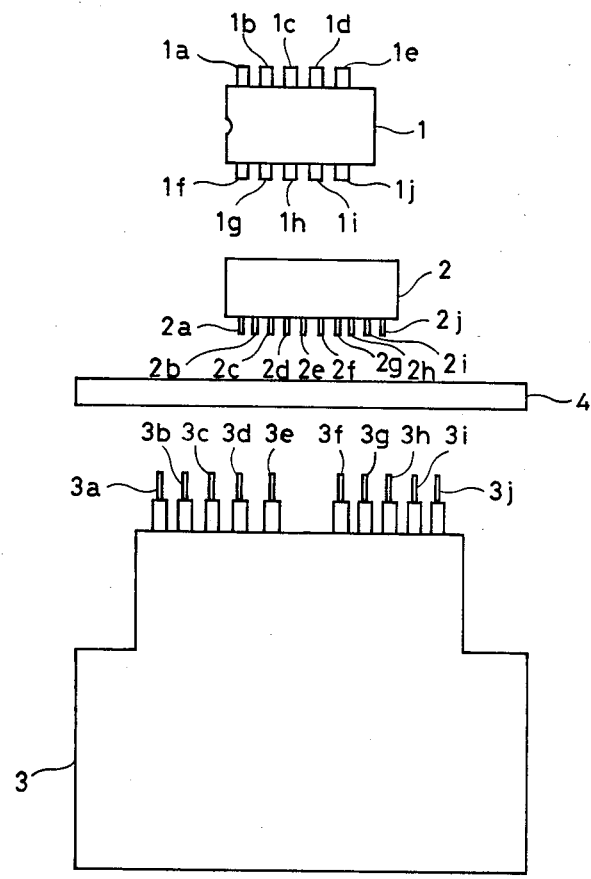
FIG. 5 is an appearance view showing an example of a conventional testing apparatus for semiconductor device.
Figure 6:
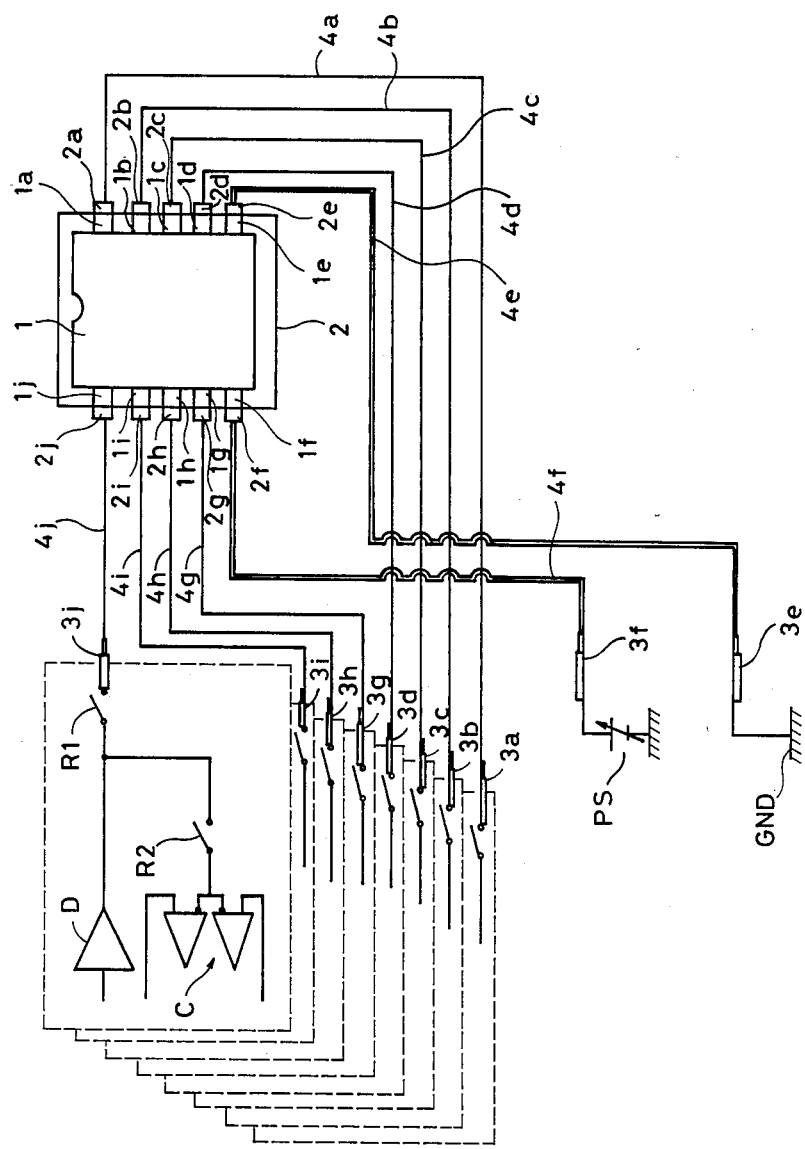
FIG. 6 is a diagram showing a connection state of the conventional testing apparatus for semiconductor device.

On the other hand, the wiring board 40 is provided with wires 4a to 4j in the same manner as in FIG. 6. The wires 4a to 4j are connected with the terminals 1a to 1j, respectively, of the DUT 1 through a socket 2 shown in FIG. 5. In addition, the wiring board 40 in this embodiment comprises memory devices FG1 to FG10 and FV1 to FV10, and relays RG1 to RG10 and RV1 to RV10 corresponding to the terminals 1a to 1j of the DUT 1, respectively. The memory devices FG1 to FG10 and the relays RG1 to RG10 serve to change a connection of the ground GND in the tester 30 with the terminals 1a to 1j of the DUT 1. The memory devices FV1 to FV10 and the relays RV1 to RV10 serve to change a connection of the power source PS in the tester 30 with the terminals 1a to 1j of the DUT 1. Flip-flops for example are used for the memory devices FV1 to FV10 and FG1 to FG10. These memory devices FV1 to FV10 and FG1 to FG10 are connected in cascade in this order to form so-called shift registers. The clock terminals CA of the respective memory devices receive shift clocks from the pin 3FC. The above stated shift registers perform shifting operation in synchronism with the shift clocks. A data terminal of the memory device FV1 as the first stage of the above stated shift registers receives serial data for designating a connection line of the power supply system from the pin 3FD. The Q output of each memory device is supplied to the memory device in the next stage. The Q outputs of the memory devices FV1 to FV10 are provided to the associated ends of the energizing coils of the relays RV1 to RV10 respectively and the Q outputs of the memory devices FG1 to FG10 are provided to the associated ends of the energizing coils of the relays RG1 to RG10 respectively. Relay energizing power sources VF are connected to the other ends of the respective energizing coils. As a result, each relay is turned on, namely, brought into a closed state when the Q output of the associated memory device is 0 to make electric current flow in the energizing coil, and each relay is turned off, namely, brought into an opened state when the Q output of the associated memory device is 1 to stop power supply to the energizing coil. The pin 3GND is connected in common to a terminal of each of the contacts of the relays RG1 to RG10. The other terminals of the contacts of the relays RG1 to RG10 are connected with the above stated wires 4a to 4j, respectively. The pin 3VCC is connected in common to a terminal of each of the contacts of the relays RV1 to RV10 and the other terminals of those contacts are connected with the wires 4a to 4j, respectively.

In the following, the operation of the embodiment shown in FIG. 1 will be described. First, in order to determine the logical states of the memory devices FV1 to FV10 and FG1 to FG10 constituting a circuit for establishing a power supply system connection line, shift clocks are provided from the pin 3FC of the tester 30 and serial data for designating a connection line of the power supply system is provided from the pin 3FD. The serial data from the pin 3FD is provided in synchronism with the shift clocks provided from the pin 3FC. The serial data from the pin 3FD is supplied to the data terminal DA of the memory device FV1 and the first bit thereof is stored first in the memory device FV1. Then, the subsequent bits of the data are successively supplied to the memory device FV1 and the previously stored bits are successively shifted to the memory device in the next stage in synchronism with the shift clocks from the pin 3FC. When the first bit of the serial data is stored in the memory device FG1 in the last stage, supply of the serial data is stopped and thus setting of the data in the respective memory devices is completed.

Now, let us consider as an example a case in which the terminal 1f of the DUT 1 is connected to the power source PS in the tester 30. In this case, data is set so that only the Q output of the memory device FV6 out of the memory devices FV1 to FV10 may be 0 and that only the Q output of the memory device FG6 out of the memory devices FG1 to FG10 may be 1. As a result, the relay RV6 is turned on and the terminal 1f is connected to the power source PS in the tester 30. On the other hand, the relay RG6 is turned off and the terminal 1f is not connected with the ground GND in the tester 30. Further, the relay R1 in the pin electronics card in the tester 30 connected to the pin 3f is turned off and the terminal 1f is not connected with the signal line in the tester 30. Thus, the terminal 1f is connected only with the power source PS in the tester 30.

Next, let us consider as another example a case in which the terminal 1e of the DUT 1 is connected with the ground GND in the tester 30. In this case, data is set so that only the Q output of the memory device FV5 out of the memory devices FV1 to FV10 may be 1 and that only the Q output of the memory device FG5 out of the memory devices FG1 to FG10 may be 0. As a result, the relay RV5 is turned off and the terminal 1e is not connected with the power source PS in the tester 30. At the same time, the relay RG5 is turned on and the terminal 1e is connected with the ground GND in the tester 30. Further, the relay R1 in the pin electronics card connected to the pin 3e is turned off and the terminal 1e is not connected with the signal line in the tester 30. Thus, the terminal 1e is connected only with the ground GND.

FIG. 2 shows relations between the Q outputs of the respective memory devices and the on or off state of the relays in the case of connection between the terminal 1f and the power source PS, in the case of connection between the terminal 1e and the ground GND and in the case of connection between the terminal 1d and the signal line connected to the pin 3d, respectively.

Although the operation of the embodiment in FIG. 1 was described by taking specified connection lines as examples, it is the same with other connection lines.

Figure 3:
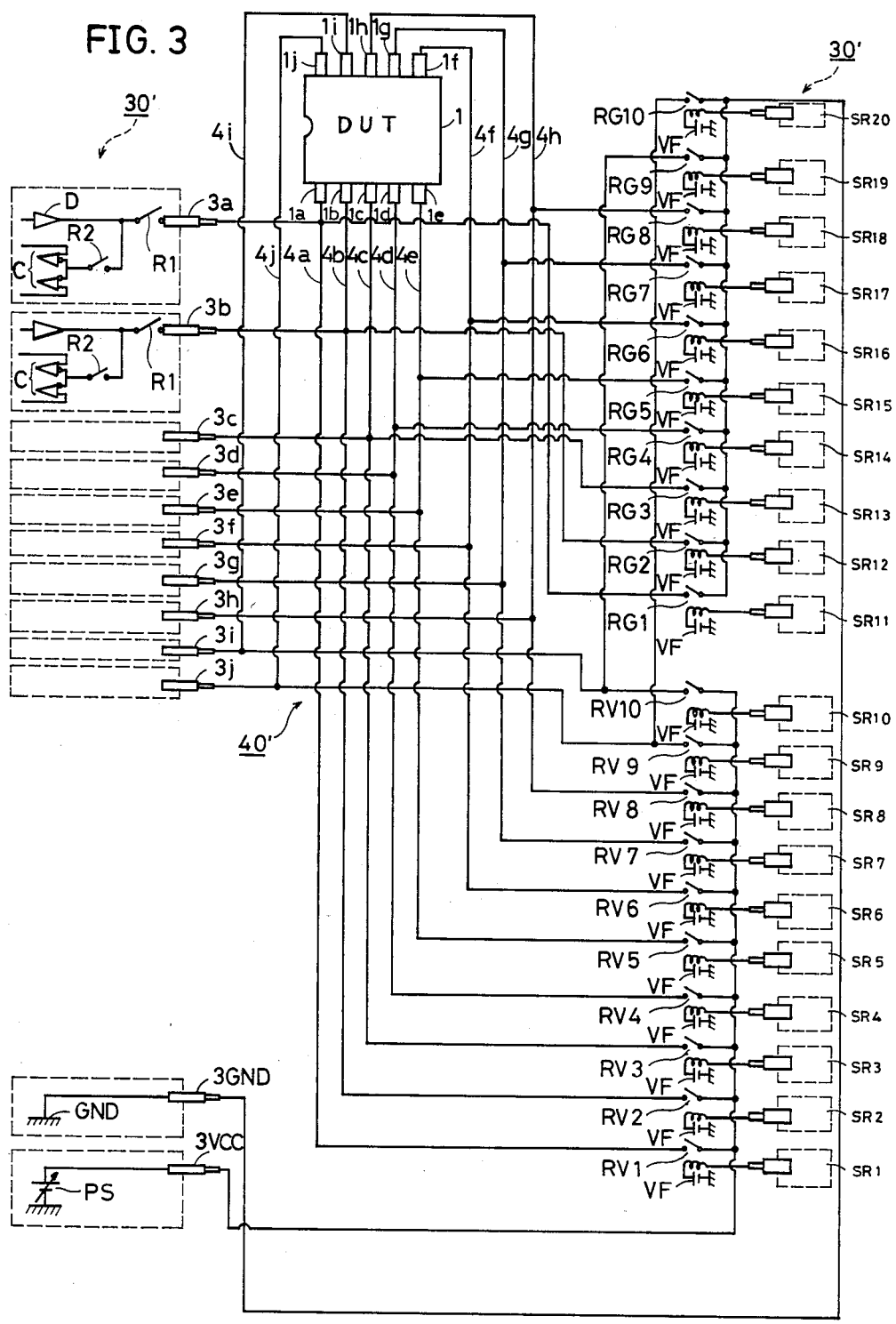
FIG. 3 is a block diagram showing another embodiment of this invention.

Although the relays RV1 to RV10 and RG1 to RG10 are turned on and off by control dependent on the logical states of the memory devices FV1 to FV10 and FG1 to FG10 in the embodiment in FIG. 1, on-off control signal generating circuits SR1 to SR20 may be provided in the tester 30' as shown in FIG. 3 so that turning on and off of the relays RV1 to RV10 and RG1 to RG10 can be controlled directly by the control signals generated from these on-off control signal generating circuits. In this case, the wiring board 40' needs not be provided with memory devices FG1 to FG10 and FV1 to FV10. In addition, in this case, the on-off control signals generated from the on-off control signal generating circuits SR1 to SR20 are required to be maintained in the output state at least till the test of the DUT 1 is completed.

Figure 4:
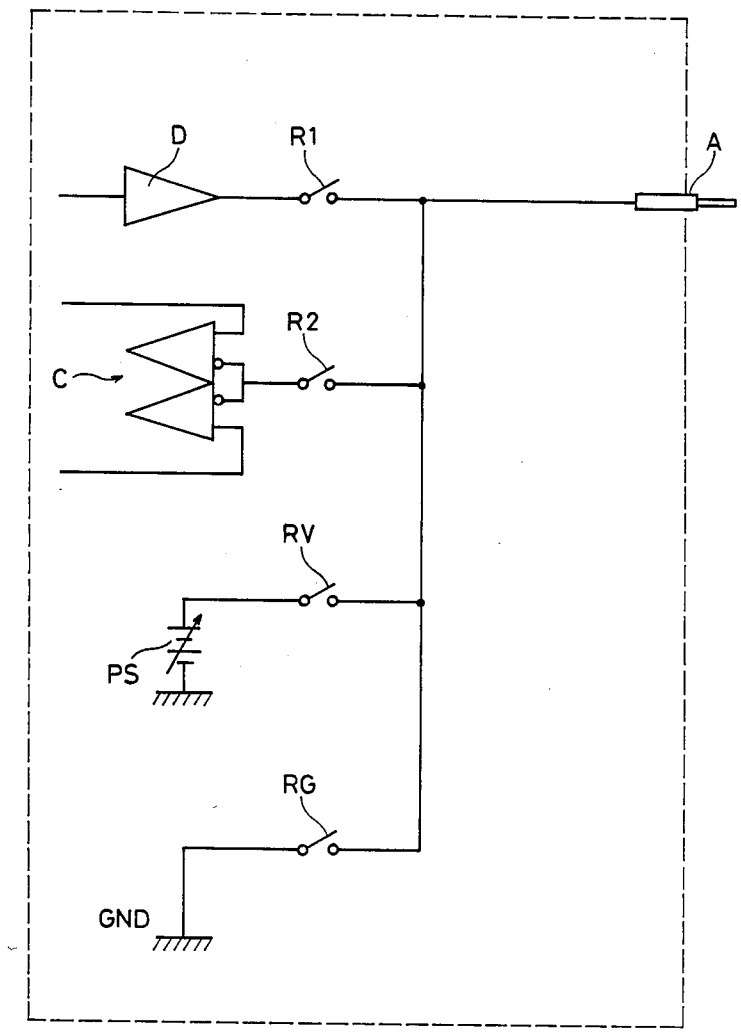
FIG. 4 is a block diagram showing a further embodiment of this invention.

Although the means for selecting connection lines between the terminals 1a to 1j of the DUT 1 and the power supply system in the tester 30 are all provided on the wiring board in the above described embodiment in FIGS. 1 and 3, those means may be provided in the pin electronics cards in the tester 30. For example, as shown in FIG. 4, the power source PS and the ground GND are provided in the pin electronics card connected to each pin A (corresponding to each of the pins 3a to 3j in FIG. 1). Further, a relay RV is provided between the power source PS and the pin A and a relay RG is provided between the ground GND and the pin A. The relays R1, R2, RV and RG are turned on and off by control based on the connection line designating program contained in the test program. More specifically, the connection between the pin A and the driver D is controlled by the relay R1; the connection between the pin A and the comparator C is controlled by the relay R2; the connection between the pin A and the power source PS is controlled by the relay RV; and the connection between the pin A and the ground GND is controlled by the relay RG. Thus, control is made so that the pin A is independently connected to or disconnected from the output signal line including the driver D, the input signal line including the comparator C, the power source PS and the ground GND.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a test fixture for selectively applying test signals to a plurality of pins of a device under test and for detecting response signals at said pins, the improvement comprising:

power source allocating means for selectively connecting first and second voltage levels of a power supply to selectable first and second pins of the device under test thereby to provide a power supply thereto, said allocating means including:

a plurality of switching means for providing said first and second voltage levels to any selected pins of the device under test, a first group of said plurality of switching means, including one switching means for each pin, providing said first voltage level to respective ones of said pins, a second group of said plurality of switching means, including another switching means for each pin, providing said second voltage level to respective ones of said pins, storage means for storing control signals for activating a subset of said plurality of switching means to provide one of said first and second voltage levels to the respective pins, said storage means comprising shift register means storing a plurality of said control signals, and further comprising control signal source means for providing a sequence of said control signals to said shift register means, and clock signal source means for providing a sequence of clock signals in synchronism with said control signals for storing said control signals in said shift register means.

2. An improved test fixture as recited in claim 1, wherein each of said plurality of switching means comprises relay means, each said relay means including a relay coil responsive to a voltage level stored in a corresponding location of said storage means and a relay contact driven by said relay coil, each said relay means corresponding to a pin being tested, a first voltage source providing said first voltage level to said first group of said switching means, a second voltage source providing said second voltage level to said second group of said switching means, whereby said control signals stored in said storage means location select pins of the device under test for receiving said first and second voltage levels.

3. An improved test fixture as recited in claim 2, wherein a first terminal of each of said relay contacts of said first group is connected to said first voltage level output by said first voltage source and a second terminal of each of said relay contacts of said first group is connected to the respective pin corresponding thereto, a first terminal of each of said relay contacts of said second group is connected to said second voltage level output by said second voltage source and a second terminal of each of said relay contacts of said second group is connected to the respective pin corresponding thereto, said first terminals of said relay contacts of said first group being connected to a first common point, said first terminals of said relay contacts of said second group being connected to a second common point.

4. An improved test fixture as recited in claim 3 wherein said shift register means comprises a plurality of flip flop means connected in sequence, an output of each of said flip flop means connected for controlling a respective one of said relay coils, said control signal source means providing said sequence of controls signal to one of said flip flop means and said clock signal source means causing said control signals to shift through successive ones of said flip flop means.

5. An improved test fixture as recited in claim 1, wherein each said switching means includes first and second sources for providing said first and said second voltage levels, wherein each of said plurality of switching means comprises relay means, each said relay means including a relay coil responsive to a voltage level stored in a corresponding location of said storage means and a relay contact driven by said relay coil, each said relay means corresponding to one pin of the device being tested.

6. In a test fixture for selectively applying test signals to a plurality of pins of a device under test and for detecting response signals at said pins, the improvement comprising:

power source allocating means for selectively connecting supply voltage levels to selectable pins of the device under test thereby to provide a power supply thereto, said allocating means including a plurality of electronics card means, including one card means for each pin, each card means comprising:

a first voltage source providing a first voltage level, a second voltage source providing a second voltage level, a plurality of switching means for selectively providing said voltage levels to any of said pins of the device under test, a first of said plurality of switching means selectively operable for providing said first voltage level to one of said pins driven by a corresponding one of said card means, a second of said plurality of switching means selectively operable for providing a second voltage level to said one of said pins driven by said corresponding one of said card means, storage means for storing control signals for activating at least one of said first switching means of said plurality of electronics card means and at least one of said second switching means on another of said plurality of electronics card means to provide one of said first and second voltage levels to one of the respective pins of the unit under test and the other of said first and second voltage levels to another of the respective pins of the unit under test, said storage means comprising shift register means storing a plurality of control signals, and further comprising control signal source means for providing a sequence of control signals to said shift register means, and clock signal source means for providing a sequence of clock signals in synchronism with said control signals for storing said control signals in said shift register means.

7. An improved test fixture as recited in claim 6, wherein each of said plurality of switching means comprises relay means, each said relay means including a relay coil responsive to a voltage level stored in a corresponding location of said storage means and a relay contact driven by said relay coil, whereby said control signals stored in said storage means location select pins of the device under test for receiving said first and second voltage levels.

8. An improved test fixture as recited in claim 7 wherein said shift register means comprises a plurality of flip flop means connected in sequence, an output of each of said flip flop means connected for controlling a respective one of said relay coils, said control signal source means providing said sequence of controls signal to one of said flip flop means and said clock signal source means causing said control signals to shift through successive ones of said flip flop means.

9. In a test fixture for selectively applying test signals to a plurality of pins of a device under test and for detecting response signals at said pins, the improvement comprising:

power source allocating means for selectively connecting first and second terminals of a power supply to selectable first and second pins of the device under test thereby to provide a power supply thereto, said allocating means including:

a plurality of switching means for providing said first and second voltage levels to any selected pins of the device under test, a first group of said plurality of switching means, including one switching means for each pin of the device under test, connecting said first terminal of the power supply to respective ones of said pins, a second group of said plurality of switching means, including another switching means for each pin of the device under test, connecting said second terminal of the power supply to respective ones of said pins, and storage means for storing control signals for activating one of said first group of switching means to connect said first terminal of the power supply to one of said pins and for activating one of said second group of switching means to connect said second terminal of the power supply to another of said pins, wherein said storage means comprises a plurality of storage devices for storing one of two signal values, a first group of said storage devices connected for activating and deactivating switching means of said first group of switching means, a second group of said storage devices connected for activating and deactivating switching means of said second group of switching means, and further comprising control means providing a first of said two signal values to a storage device of said first group for controlling a corresponding first switching means in said first group of switching means to connect said first terminal of the power supply to a corresponding first pin of the device under test, said control means providing the other of said two signal values to a storage device of said second group for controlling a corresponding first switching means in said second group of switching means to disconnect said second terminal of the power supply from said corresponding first pin of the device under test, said control means providing the first of said two signal values to another storage device of said second group for controlling a corresponding second switching means in said second group of switching means to connect said second terminal of the power supply to a corresponding second pin of the device under test, said control means providing the other of said two signal values to another storage device of said first group for controlling a corresponding second switching means in said first group of switching means to disconnect said second terminal of the power supply from said corresponding second pin of the device under test.

10. An improved test fixture as recited in claim 9, wherein said control means further provides said other signal value to each of the remaining storage devices of said first group for controlling the remaining switching means in said first group of switching means to disconnect said first terminal of the power supply from the remaining pins of the device under test and said control means further provides said other signal value to each of the remaining storage devices of said second group for controlling the remaining switching means in said second group of switching means to disconnect said second terminal of the power supply from the remaining pins of the device under test.

* * * * *